(12) United States Patent
Lee et al.

(10) Patent No.: US 7,519,138 B2
(45) Date of Patent: *Apr. 14, 2009

(54) METHOD AND APPARATUS FOR DATA RECOVERY IN A DIGITAL DATA STREAM USING DATA EYE TRACKING

(75) Inventors: Sang-Hyun Lee, Wanju-gun (KR); Deog-Kyoon Jeong, Seoul (KR)

(73) Assignee: Silicon Image, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/962,066

(22) Filed: Dec. 20, 2007

(65) Prior Publication Data

US 2008/0152057 A1    Jun. 26, 2008

Related U.S. Application Data

(63) Continuation of application No. 11/498,355, filed on Aug. 2, 2006, now Pat. No. 7,315,598, which is a continuation of application No. 09/943,029, filed on Aug. 29, 2001, now abandoned.

(60) Provisional application No. 60/229,369, filed on Aug. 30, 2000.

(51) Int. Cl.
    *H04L 7/00*    (2006.01)
(52) U.S. Cl. .................... 375/355; 340/146.2
(58) Field of Classification Search ............... 375/355; 340/146.2
    See application file for complete search history.

(56) References Cited

U.S. PATENT DOCUMENTS 3,633,115 A    1/1972    Epstein

| 4,218,771 A | 8/1980 | Hogge, Jr. |
| 4,538,283 A | 8/1985 | Hogge, Jr. |
| 4,584,695 A | 4/1986 | Wong et al. |
| 4,821,297 A | 4/1989 | Bergmann et al. |
| 5,432,480 A | 7/1995 | Popescu |

(Continued)

FOREIGN PATENT DOCUMENTS

| EP | 0317159 A2 | 5/1989 |
| JP | 2250535 | 10/1990 |
| JP | 7221800 | 8/1995 |

OTHER PUBLICATIONS

Jin-Ku Kang, "A CMOS high-speed data recovery circuit using the matched delay sampling technique", IEEE Journal of Solid-State Circuits, vol. 32, Issue 10, Oct. 1997 pp. 1588-1596.*

Maneatis, John G., Low-jitter process-independent DLL and PLL based on self-biased techniques *IEEE Journal of Solid-State Circuits*, No. 11:1723-1732 (1996).

(Continued)

*Primary Examiner*—Juan A Torres
(74) *Attorney, Agent, or Firm*—Perkins Coie LLP (57) ABSTRACT

A data recovery system for a serial digital data link includes a data sampler, compare logic, a phase controller, and a phase shifter. The data sampler samples input data three times in a bit time which time is determined by clock pulses generated by the phase shifter, and recovers digital data according to a predetermined decision criterion. The compare logic compares the output of the data sampler according to a predetermined method. Phase controller uses the output of the compare logic and generates phase control signals. The phase shifter uses the phase control signals and makes three different phase clocks from input clock. The input clock can be an external clock, or can be recovered from the external clock or input data stream.

11 Claims, 6 Drawing Sheets

U.S. PATENT DOCUMENTS

| | | |
|---|---|---|
| 5,455,540 A | 10/1995 | Williams |
| 5,481,563 A | 1/1996 | Hamre |
| 5,554,945 A | 9/1996 | Lee et al. |
| 5,870,445 A | 2/1999 | Farwell |
| 5,896,391 A | 4/1999 | Solheim |
| 6,477,200 B1 * | 11/2002 | Agazzi et al. ............... 375/233 |
| 6,639,956 B1 * | 10/2003 | Song .......................... 375/354 |

OTHER PUBLICATIONS

Rau et al., "Clock/Data Recovery PLL Using Half-Frequency Clock," *IEEE Journal of Solid-State Circuits*, No. 7:1156-1160 (1997).

Poulton et al., "A Tracking Clock Recovery Receiver for 4 Gbps Signaling," *IEEE Micro*, pp. 25-26 (1998).

* cited by examiner

METHOD AND APPARATUS FOR DATA RECOVERY IN A DIGITAL DATA STREAM USING DATA EYE TRACKING

CROSS REFERENCE TO RELATED APPLICATIONS

This is a continuation of U.S. application Ser. No. 11/498,355 filed Aug. 2, 2006 entitled "Data Recovery Using Data Eye Tracking," which will issue on Jan. 1, 2008 as U.S. Pat. No. 7,315,598, and which is a continuation of U.S. application Ser. No. 09/943,029, filed Aug. 29, 2001, now abandoned, which claims priority under 35 U.S.C. § 119(e) to U.S. Provisional Application Ser. No. 60/229,369, filed Aug. 30, 2000, which applications are incorporated by reference herein in their entirety.

BACKGROUND OF THE INVENTION

1. Technical Field

This invention relates generally to data communications, and more specifically to data recovery for serial digital data link.

2. Description of the Related Art

A number of digital data recovery systems are based on a sampling recovery method that uses sampled data to control the data sampling time. For example, Rau discloses a method for serial non-return-to-zero (NRZ) data transmission. See Rau et al., "Clock/Data Recovery PLL Using Half-Frequency Clock," IEEE Journal of Solid-State Circuits, pp. 1156-1160, No. 7, July 1997. Rau includes a general feature of phase-locked loops (PLLs) that includes a phase detector, a loop filter, and a voltage-controlled oscillator (VCO). The structures and operations of the loop filter and the VCO are the same as generally known to those skilled in the field. But, an unusual feature of the design is the phase detector, which uses a delay-locked loop (DLL) to generate multiple sampling clocks. The VCO can run at a clock rate lower than the data rate, specifically at half the data rate.

The PLL adjusts the clock to an incoming data stream. Because of the random nature of data, data transition does not necessarily occur at every clock cycle. The loop must handle a sequence of consecutive zeros or ones in the data stream. In general, for good loop performance, the control signal should be proportional to the phase error. However, at very high operating frequencies, analog signals depend on the data pattern and become highly nonlinear because they do not settle during the bit duration. On the other hand, clock recovery schemes based on sampling techniques result in uniform digital control pulses.

The data stream is sampled twice within a bit time (the time between received bits). The first of the sampled data are the recovered data, forming the output stream at the original data rate. The second sampled data, which are sampled at half of the bit time later than the first, are used for phase decision. If data transition occurs, and the second sampled data equal the first, it indicates that the sampling phase is early. The frequency of the VCO is then lowered and the sampling phase is delayed. On the contrary, if data transition occurs, and the second sampled data are not equal to the first, it indicates that the sampling phase is late. The frequency of the VCO is then raised and the sampling phase is advanced. If there is no data transition, the phase detector operates so that there is no control on the sampling phase. The stable operating point of the sampling loop is reached when the second sampling is done exactly at the data transition. This so-called bang-bang operation can make the clock jitter smaller than the one introduced by data dependent and nonlinear analog pulses at high frequencies.

Poulton discloses a similar data recovery scheme. See Poulton et al., "A Tracking Clock Recovery Receiver for 4 Gbps Signaling," IEEE Micro, pp. 25-26, January-February 1998. The system is aimed at a higher data rate and uses a demultiplexing receiver to recover high frequency data with a lower frequency clock. The clock rate is one tenth of the data rate. Therefore, the receiver produces 20 samples of the incoming bit stream. Half of the samples are used to output the recovered data stream, while the remaining half are used for phase control as in Rau. Up and Down signals are generated for each of the 10 sample pairs, and the results are summed by an analog summer to generate a differential analog phase control voltage pair. This operation is performed using a switched capacitor filter summer. In this system, the sampling phase is generated by a phase shifter and a delay-locked loop (DLL). The Up/Down signals control the bias voltage of the phase interpolator in the phase shifter and make the phase of the phase shifter output either advanced or delayed. The 20 phase clocks are generated as the outputs of the consecutive delay stage in the DLL.

The above-described systems are tracking receivers. They control sampling instants by using twice oversampled data. They find the transition edge of an input data stream using the bang-bang operation, and sample the valid data at the position that is half of the bit time distance from the transition edge. If the received data stream has no jitter and is not distorted by the channel, the sampling phase is not critical to the receiver performance. If the received data stream has a small jitter but is not distorted by the channel, the sampling phase may be deviated from the center of the data eye without any performance degradation. But if the received data stream has a jitter comparable to a bit time or is heavily distorted by the channel, the sampling phase deviation from the eye center has a great impact on the performance such as a bit-error-rate (BER). Furthermore, if the jitter is not distributed symmetrically around the transition center, the eye center cannot be correctly tracked by the above two methods.

SUMMARY OF THE INVENTION

A described embodiment of the present invention provides a data recovery apparatus that can give accurate phase tracking for a serial digital data link.

A described embodiment of the present invention provides a data recovery apparatus that is based on indirect statistical bit-error-rate measurements.

A described embodiment of the present invention provides a data recovery apparatus where the sampling phase tracks the practical data eye rather than the data transition center.

The foregoing are accomplished by the present invention providing data recovery that can be used for a serial digital data link. It is particularly suitable for a very high speed data link that suffers from jitter and signal shape distortion. The system is devised so that better data recovery is possible under the above conditions. The key idea is to make the timing loop track the center of data transition, instead of the practical eye-opening. The center of the data eye may not be matched to the half bit time distance from the transition center as discussed above. In this case, this invention could achieve much lower bit-error-rate than prior tracking receivers.

The eye opening is tracked by an indirect statistical method by measuring a pseudo bit-error-rate. Practically, there is no way for the receiver to measure a bit-error-rate directly because the receiver does not have information about the transmitted data stream while it samples it. Here, basically three-times oversampling in a bit time is used based on the assumption that the output stream made of center sampled data is the same as the transmitted data stream. The advanced and delayed sampling is used to compare the sampled data to the center sampled data. By summing and/or averaging the compared results over some bit time, a pseudo bit-error-rate is achieved. If one data bit is sampled in one clock cycle, the summing can be done by a charge pump or other types of integrating devices. Practically, this is a method used in a PLL including a charge pump. Or if multiple data bits are sampled in a clock cycle, the summing can be done by simply summing the comparison results in a clock cycle. The summing device can be implemented as a digital device or analog device. An example of this summing method is described in Poulton.

The assumption that the output stream made of center sampled data is the same as the transmitted data stream may seem unreasonable. But, under a steady locked state, if the signal-to-noise ratio (SNR) is high enough, this assumption gives good results on the pseudo bit-error-rate measurement. Under an out-of-lock state, although the pseudo bit-error-rate measured by this method will not match the real bit-error-rate, the timing loop can make the sampling phase go locked and track the eye opening.

The tracking ability depends greatly on the loop design. The loop is designed so that the three sampling phases are within the eye opening with some margin. This is accomplished by at least two loop control paths. The phase control signal from one path is used to control the phase width (time duration) from an advanced sampling phase to a delayed sampling phase. The signal is determined by the sum of the pseudo bit-error-rate at the advanced sampling position and that at the delayed sampling position. The phase control signal from the other path is used to control the position of the center sampling phase, which, of course, changes the positions of the advanced and delayed sampling phases. The signal is determined by the difference of the two pseudo bit-error-rates at the advanced and delayed sampling positions.

A described embodiment of the present invention comprises a data sampler, compare logic, a phase controller, and a phase shifter. The data sampler includes three latches. The latches latch outputs according to the input data when triggering occurs by a clock edge. Compare logic compares the three latched data and gives an output indicating whether the sampling phase is early or late compared to the eye opening. This output corresponds to the measurement of the pseudo bit-error-rates at the advanced and delayed sampling positions. The phase controller includes two loop control sub-blocks. One of the sub-blocks generates a control signal that controls the position of the center sampling phase. It calculates the difference of the two pseudo bit-error-rates and integrates by a loop filter, which can be made of a charge pump. The other sub-block generates a control signal that controls the phase width between the advanced and delayed sampling phases. It adds the two pseudo bit-error-rates and passes through a loop filter. The phase shifter makes the three sampling clocks under control of the two-phase control signals.

DETAILED DESCRIPTION OF PREFERRED EMBODIMENTS

Figure 1:
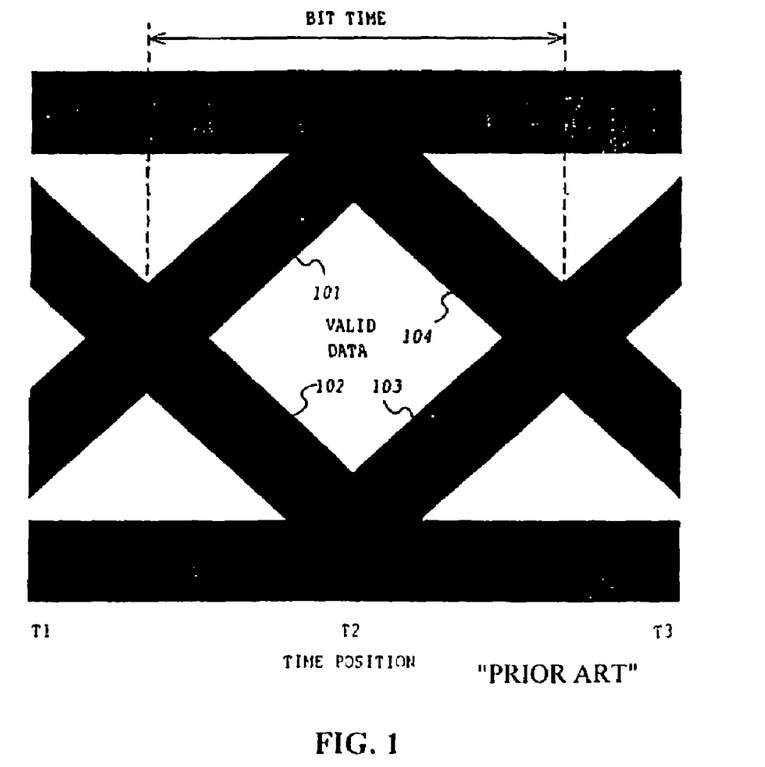
FIG. 1 shows the data eye diagram for a serial digital data link.

FIG. 1 shows a typical data eye pattern that is a superposition of multiple data transitions with a horizontal displacement indicative of the jitter that may be observed in an actual data link. The source of the jitter may be: (1) transmitter clock jitter generated by power supply fluctuation or any other noise, (2) inter-symbol interference caused by the mixture of randomly transmitted data pattern and channel attenuation, or (3) a jitter source in a receiving device similar to that of a transmitting device. The first and second terms reflect direct jitter sources that can be measured by a measurement device. The last term is not measurable, but it also affects the receiving performance. In FIG. 1, the diamond shape surrounded by 101, 102, 103, 104 and indicated by 'VALID DATA' is the eye opening area. The vertical length of the eye opening at a certain time position represents the signal strength (energy) at time. So it is desired to sample the data stream at time position T2, the maximum eye position. If the sampling phase deviates from T2 to T1 or to T3, the bit-error-rate would be increased.

Figure 2:
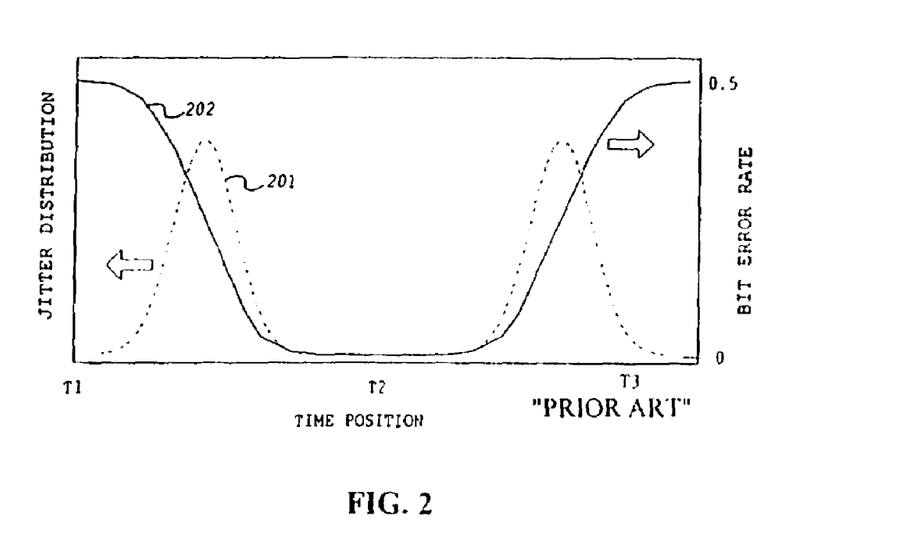
FIG. 2 shows the jitter distribution and bit-error-rate with the same time base shown in FIG. 1.

FIG. 2 shows a typical jitter distribution probability 201 for the eye pattern of FIG. 1 with the same horizontal axis, and it also shows the bit-error-rate 202 as a function of the sampling phase. In the figure, the jitter is shown to be distributed symmetrically around the center of data transition. In this case, the eye opening will be halfway between the left and right transition center. But, in some cases, the eye opening may not be symmetric, having a long tail in one direction when the jitter source is heavily biased in one direction. Therefore, the eye opening leads or lags the halfway position. The tracking receivers presented in Rau and Poulton make the sampling phase track the transition center. Those are well suited for a symmetric jitter distribution, but not for a non-symmetric distribution.

Figure 3A:
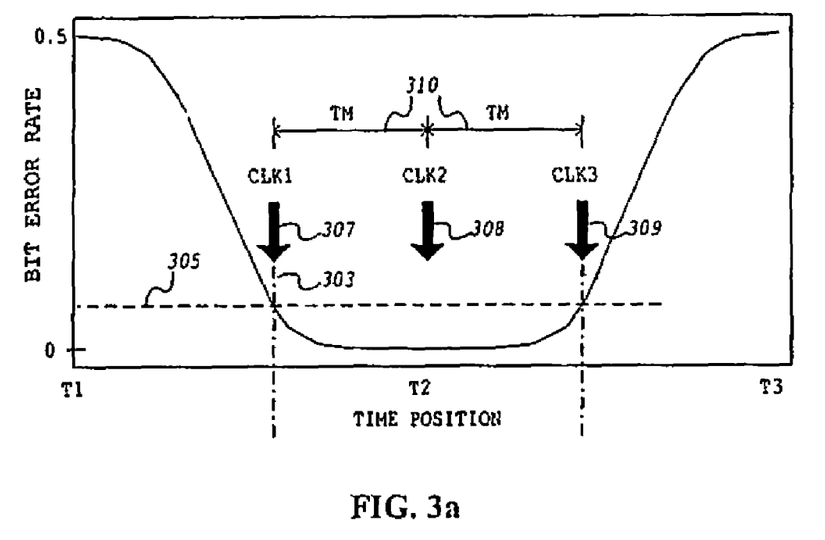
FIGS. 3a and 3b are illustrative diagrams showing the three sampling phases of am embodiment of the invention.
Figure 3B:
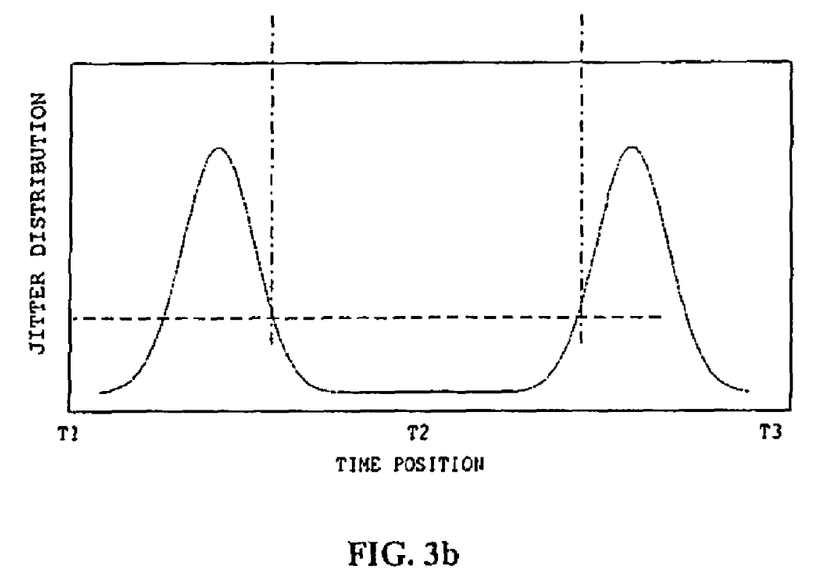

FIGS. 3a and 3b show three sampling phases of an embodiment of the invention. 'CLK2' 308 is the clock for the center sampling phase of an embodiment of the invention. 'CLK1' 307 and 'CLK3' 309 represent the clocks for advanced and delayed sampling phases, respectively. Assuming that the center-sampled data by 'CLK2' 308 is correct, the bit-error-rate could be measured by comparing the two data sampled by 'CLK1' 307 and by 'CLK3' 309 to the center sampled data. The bit-error rate will be simply 'zero' or 'one' if the sampled results are compared for only one bit. The bit-error rate will be some number between 'zero' and 'one' if multiples of sampled results are compared for a predetermined time duration or for a predetermined number of bits given by a demultiplexing receiver such as that shown in Poulton. If the measured bit-error rate is greater than a predetermined value 305 (or a predetermined margin), the corresponding sampling phase would be apart from the eye opening, and be in the jitter region. The term 'predetermined margin' indicates that the phases of 'CLK1' and 'CLK3' do not exactly coincide to the edge of the data eye. The data eye is related to the probabilistic distribution of jitter. Furthermore, the phase controller has a low pass filter, which makes the phases of 'CLK1' and 'CLK3' determined by the past history of random jitters on the data.

In the present invention, 'CLK2' 308 is controlled by a phase control signal that is determined from the difference of the bit-error-rate measured at 'CLK1' 307 and the one measured at 'CLK3' 309. 'CLK1' 307 and 'CLK3' 309 are advanced and delayed from 'CLK2' 308 by the time difference of 'TM' 310, respectively. The time difference 'TM' 310 is controlled by another phase control signal that is determined from the summation of the two bit-error-rate. If bit-error-rate at 'CLK1' 307 is greater than the one at 'CLK3' 309, it means that the overall sampling phase leads the eye opening. Therefore, the phase of 'CLK2' 308 is delayed until the two bit-error-rate becomes equal. On the contrary, if the bit-error-rate at 'CLK1' 307 is smaller, the phase of 'CLK2' 308 is advanced. If the sum of the two bit-error-rate exceeds a predetermined value, 'TM' 310 is decreased to shrink the sampling window to the eye opening. If the sum is less than predetermined value, 'TM' 310 is increased.

The mechanism described above on the dual phase control operates correctly when the data recovery loop is in a steady locked state. Although many other cases of the unlocked state may be considered, the mechanism can make the loop enter the locked state eventually. If it is desired to make the system operate more efficiently and go to lock faster, a certain lock-aiding apparatus could be added.

Figure 4:
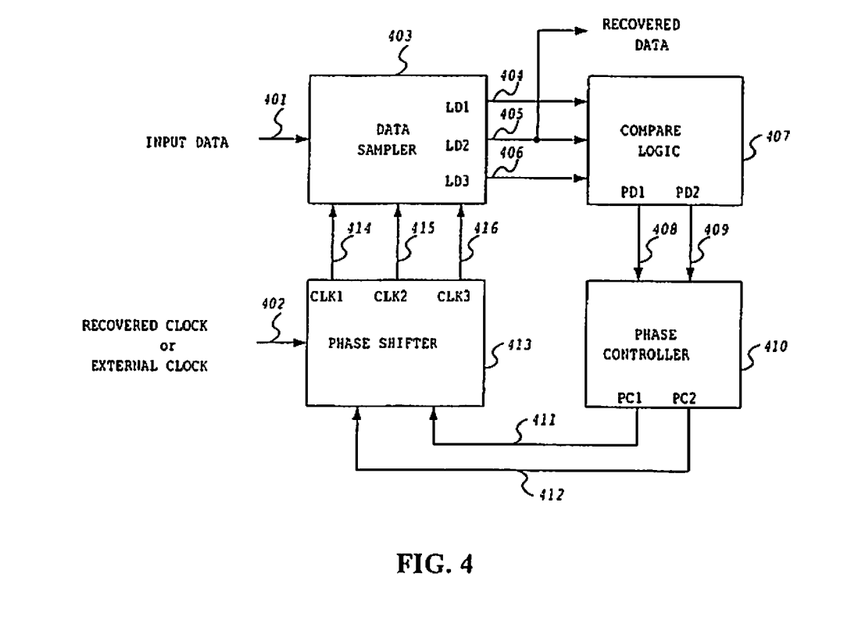
FIG. 4 is a system block diagram illustrative of an embodiment of the invention.

FIG. 4 is a system block diagram of an embodiment of the present invention. The overall system includes a data sampler 403, compare logic 407, a phase controller 410, and a phase shifter 413. Input data 401 comes from the channel directly or is the output of any type of filter, pre-amplifier, buffer, etc which modifies the shape of the signal from the channel. The data sampler 403 oversamples and latches the input data 401 by a predetermined decision criterion. Compare logic 407 compares the latched data 404, 405, 406 and measures the pseudo bit-error-rate for the sampled data set. The phase controller 410 decides the phase relationship between the sampling clocks 414, 415, 416 and input data 401, and outputs phase control signals 411, 412 through a loop filter, which is a low pass filter such as charge pump, RC filter, etc. Phase shifter 413 splits and shifts the phase of the input clock 402 to make the desired three phase clocks 414, 415, 416. The input clock 402 could be externally supplied from transmitter or other control device, or could be recovered from the input data stream 401. The frequency of input clock 402 is matched to the input data rate so that the recovery loop does not lose lock owing to the frequency difference.

Figure 5:
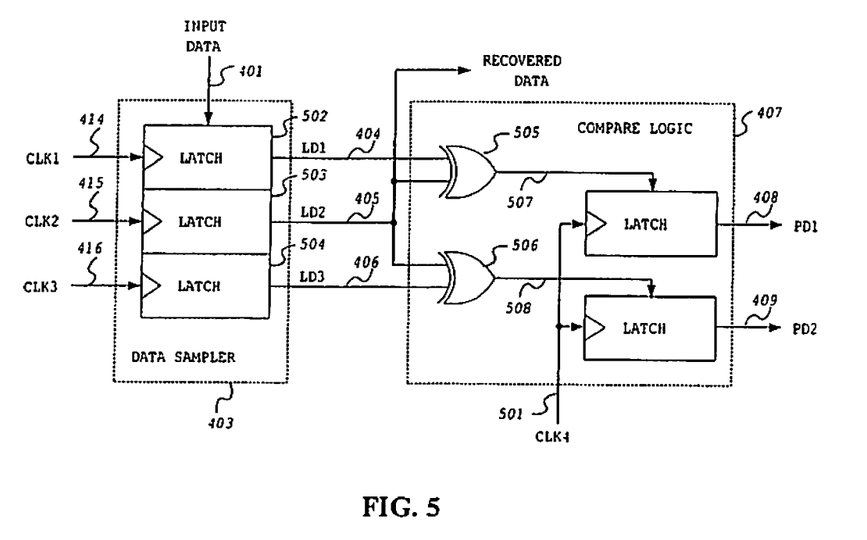
FIG. 5 is a detailed block diagram of the data sampler and compare logic of FIG. 4.

FIG. 5 shows a detailed block diagram of the data sampler 403 and the compare logic 407. The data sampler 403 has three latches 502, 503, 504. They latch input data on triggering of the three clock signals 'CLK1' 414, 'CLK2' 415, 'CLK3' 416 respectively. The outputs of the data sampler, 'LD1' 404, 'LD2' 405, 'LD3' 406, are provided to the compare logic 407, while 'LD2' 405 makes an output stream as the recovered data.

Compare logic 407 compares 'LD1' 404 and 'LD3' 406 with 'LD2' 405 by comparing means, which is implemented as XOR gate 505, 506 in the figure. Because of the different latching time for 'LD1' 404, 'LD2' 405 and 'LD3' 406, it is better to latch the comparison results 507, 508 by another clock 'CLK4' 501 rather than directly output the results. This clock 501 should not overlap the meta-stable time duration during which the comparison results are meaningless. Therefore, 'CLK4' 501 should trigger the latch before 'LD1' 404 is latched or after 'LD3' 406 is latched.

Figure 6:
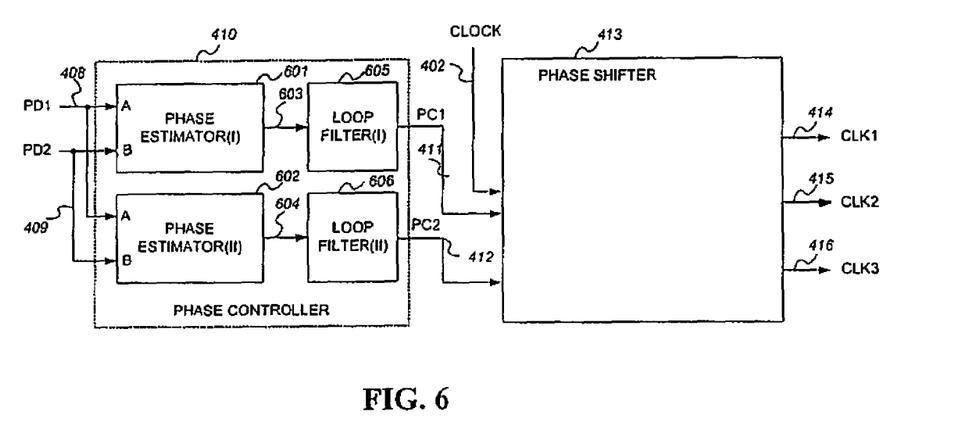
FIG. 6 shows a block diagram of a phase controller and phase shifter of FIG. 4.

FIG. 6 shows a detailed block diagram of phase controller 410 and a block diagram representing phase shifter 413. Phase controller 410 gets the outputs of compare logic 407, 'PD1' 408 and 'PD2' 409, and estimates the phase relationship between the latching clock 414, 415, 416 and input data 401. The phase of 'CLK2' 415 could be estimated by phase estimator(I) 601, which calculates the difference of 'PD1' 408 and 'PD2' 409. This estimation result 603 is fed to loop filter(I) 605 to generate the low-pass filtered output 'PC1' 411, which determines the phase delay of 'CLK2' 415. The phase difference 'TM' 310 between 'CLK2' 415 and the other two clocks 414, 416 could be estimated by phase estimator(II) 602, which calculates the sum of 'PD1' 408 and 'PD2' 409. This estimation result 604 is fed to loop filter (II) 606 and generates the other low-pass filtered output 'PC2' 412. 'PC2' 412 determines the amount of phase advance and phase delay for 'CLK1' 414 and 'CLK3' 416 respectively. There are many different ways to implement the phase estimators 601, 602. We can determine the weighted difference or sum for faster lock-in time. Some offset may be added to the output 604 of phase estimator (II) 602 to modify the tracking behavior.

The phase shifter 413 comprises a phase delay.

Figure 7:
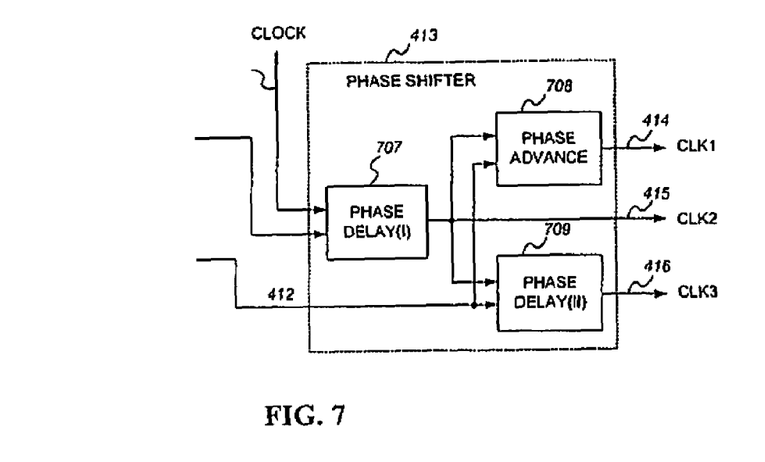
FIGS. 7-10 show more detailed block diagrams of embodiments of the phase shifter of FIG. 6.

FIG. 7 shows a first embodiment of phase shifter 413, including a phase delay(I) 707, a phase advance 708, and a phase delay (II) 709. Phase delay(I) 707 is used to adjust the phase of 'CLK2' 415 under control of 'PC1' 411. Phase delay 707 can be made up of a cascade of MOSFET inverters or a resistor-capacitor (RC) delay circuit, where 'PC1' 411 acts as the bias current or bias voltage. Phase advance 708 and phase delay (II) 709 are used to adjust the phase difference of 'CLK1' 414 and 'CLK3' 416 from 'CLK2' 415.

Figure 8:
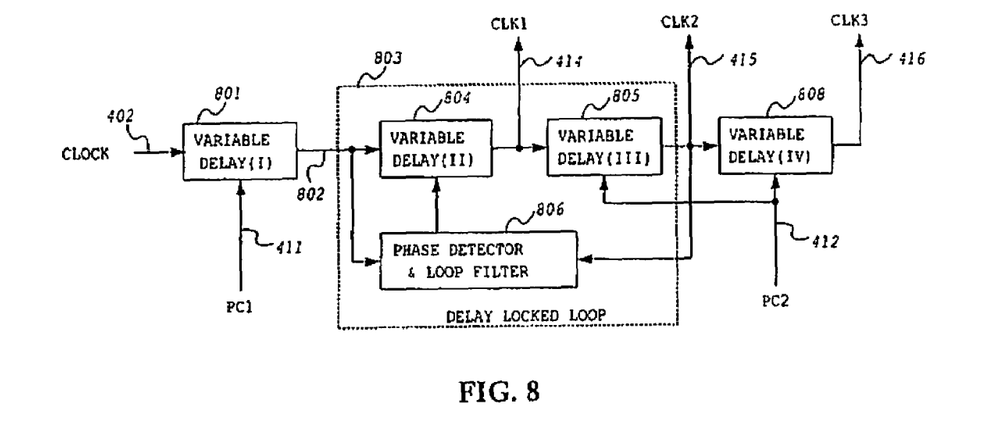

FIG. 8 shows a second embodiment of the phase shifter 413, which comprises four variable delays 801, 804, 805, 808 and further comprises a phase detector and a loop filter 806. Variable delay(I) 801 is controlled by 'PC1' 411 and adjusts the phase of its output 802. Variable delay(II) 804, variable delay(III) 805, and phase detector and loop filter 806 make up delay-locked loop 803, which makes the phase of 'CLK2' 415 tracks the phase of variable delay(I)'s output 802. Variable delay(III) 805 is controlled by 'PC2' 412 and adjusts the phase difference between 'CLK1' 414 and 'CLK2' 415. Variable delay(IV) 808 is a replica of variable delay(III) 805 and is also controlled by 'PC2' 412. Therefore, the phase difference between 'CLK2' 415 and 'CLK3' 416 is the same as that between 'CLK1' 414 and 'CLK2' 415.

Figure 9:
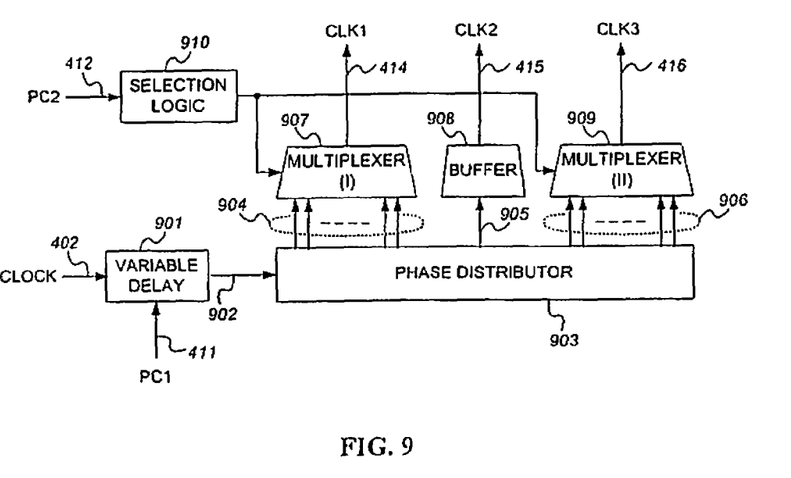

FIG. 9 shows a third embodiment of phase shifter 413. It comprises variable delay 901, phase distributor 903, multiplexer(I) 907, multiplexer(II) 909, buffer 908, and selection logic 910. Variable delay 901 has the same function as variable delay(I) 801 in FIG. 8. Phase distributor 903 is a kind of delay-locked loop or phase-locked loop that makes multiples of different phase clocks 904, 905, 906, where the phase of 905 tracks the phase of 902. Here 904 is a bundle of clocks that lead 905 in phase, where the amount of phase leading lies between zero and half bit time. Selection logic 910 controls multiplexer(I) 907 so that it passes one of multiple input clocks 904. Therefore, the phase difference of 'CLK1' 414 and 'CLK2' 415 can be adjusted by 'PC2' 412. Bundle of clocks 906 that lag 905 in phase are input to multiplexer(II) 909, where one of those is selected so that the phase difference between 'CLK2' 415 and 'CLK3' 416 is the same as that between 'CLK1' 414 and 'CLK2' 415. The purpose of buffer 908 is that the propagation delay through itself 908 is the same as that through multiplexers 907, 909 so the phase relationships between 'CLK1' 414, 'CLK2' 415 and 'CLK3' 416 are more accurately controlled.

Figure 10:
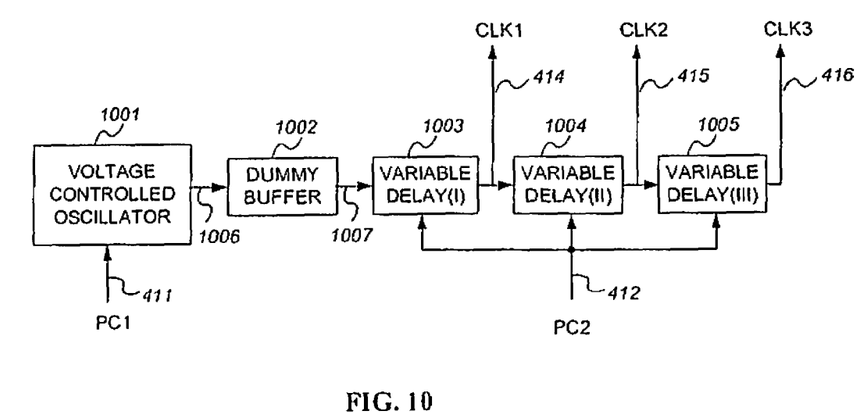

FIG. 10 shows a fourth embodiment of phase shifter 413. It comprises a voltage-controlled oscillator 1001, variable delay circuits 1003, 1004, 1005, and a dummy buffer 1002. It does not need the input clock 402 because it uses a voltage-controlled oscillator as a clock source. A voltage-controlled oscillator is controlled by 'PC1' 411 and generates a clock whose frequency is adjusted so that the phase of 'CLK2' 415 is located at the optimum sampling position. Variable delay circuits 1003, 1004, 1005 are controlled by 'PC2' 412 and generates 'CLK1' 414, 'CLK2' 415, and 'CLK3' 416, respectively. The dummy buffer 1002 is an optional circuit that could be included so as to match the phase difference between the three clocks 414, 415, 416 equally. For the embodiment of FIG. 10, the phase of 'CLK2' 415 should be controlled by 'PC1' 411 only and should not be affected by the variation of 'PC2' 412. And the phase differences between the three clocks 414, 415, 416 should be affected by 'PC2' 412 and should not be affected by the variation of 'PC1' 411. If frequency range of the voltage controlled oscillator 1001 is wide, it may be difficult for the phase of 'CLK2' 415 to track the optimum sampling position because of the initial acquisition failure. To avoid this difficulty, we can add a reference loop. See Richard Gu et al, "A 0.5-3.5 Gb/s Low-Power Low-Jitter Serial Data CMOS Transceiver," ISSCC Digest of Technical Papers, pp. 352-353, February 1999. Upon power-up or reset, the data recovery system is defaulted to the reference loop so that the frequency of the voltage controlled oscillator 1001 output is locked to an external reference clock. After initial lock is acquired, the loop containing the signals 'PC1' 411 and 'PC2' 412 is enabled.

This invention has been described in a considerable detail in order to provide those skilled in the art enough information to apply the principles and to implement the components. The system shown in FIG. 4 through FIG. 6 is applicable to data recovery which samples one bit data per clock. Skilled engineers can modify or expand this embodiment for use in a complex recovery system such as half-frequency receiver of Rau's or the demultiplexing receiver of Poulton's. The present invention can be applied to various types of coding such as NRZ, Manchester, binary PAM, M-ary (multi-level) PAM, etc. The invention can be carried out by different equipment and devices than those described herein, and various modifications, both as to the equipment details and operating procedures, can be accomplished without departing the scope of the invention itself.

While the invention has been described with reference to preferred embodiments, it is not intended to be limited to those embodiments. It will be appreciated by those of ordinary skilled in the art that many modifications can be made to the structure and form of the described embodiments without departing from the spirit and scope of this invention.

What is claimed is:

1. A data recovery method for a digital data stream of input data, comprising:
receiving at least two control signals, by a phase controller, and outputting at least three sampling clocks in a bit time, where the phase of said at least three sampling clocks are adjustable;
receiving said at least three sampling clocks and sampling the input data using said at least three sampling clocks as triggers, and providing at least three sampled data signals, where one of said at least three sampled data signals is used to output recovered data;
receiving said at least three sampled data signals and comparing said at least three sampled data signals to said recovered data and providing at least a first pseudo-bit error value and a second pseudo-bit error value; and
receiving said at least first pseudo-bit error value and said second pseudo-bit error value and estimating the phase relationship between the input data and said at least three sampling clocks using said at least first pseudo-bit error value and said second pseudo-bit error value; and
adjusting the phases of said at least three sampling clocks in response to receipt of said at least two control signals and said estimated phase relationship.

2. The method of claim 1, wherein the adjusting of the phases further comprises:
outputting a first sampling clock of said at least three sampling clocks using an input clock which is one of a outputting a second sampling clock of said at least three sampling clocks that advances said first sampling clock in phase;
outputting a third sampling clock of said at least three sampling clocks that is delayed from said first sampling clock in phase; and
arranging the phases of the at least three sampling clocks within an eye opening of the input data stream with a predetermined margin.

3. A data recovery method for a digital data stream of input data, comprising:
receiving at least two control signals, by a phase controller, and outputting at least three sampling clocks in a bit time, where the phase of said at least three sampling clocks are adjustable;
receiving said at least three sampling clocks and sampling the input data using said at least three sampling clocks as triggers, and providing at least three sampled data signals, where one of said at least three sampled data signals is used to output recovered data;
receiving said at least three sampled data signals and comparing said at least three sampled data signals to said recovered data and providing at least a first pseudo-bit error value and a second pseudo-bit error value; and
receiving said at least first pseudo-bit error value and said second pseudo-bit error value and estimating the phase relationship between the input data and said at least three sampling clocks using said at least first pseudo-bit error value and said second pseudo-bit error value, and providing said at least two control signals to a phase shifter according to said estimated phase relationship.

4. A data recovery method for a very high speed digital serial data stream of input data that suffers from jitter and signal shape distortion and that enables a low bit-error-rate even where the jitter has a non-symmetric jitter distribution around the center of data transition, the method comprising:
outputting at least three sampling clocks in a bit time, by a data sampler, where the phase of said at least three sampling clocks are adjustable to split and shift the phase of an input clock, the input being externally supplied from a control device, the input clock having a frequency that is matched to an input data rate;
over sampling and latching input data by a predetermined decision criterion using said at least three sampling clocks as triggers, and for providing multiple sampled data signals, where one of said multiple sampled data signals is used to output recovered data and two other outputs of said multiple sampled data signals are provided to compare logic, the over sampling and latching including performing three latching operations that latch input data on triggering of said at least three sampling clocks;
comparing said over sampled and latched data signals to said recovered data and providing at least a first pseudo-bit error value and a second pseudo-bit error value for said over sampled and latched data signals, said comparing using an additional clock to latch comparison results and providing an output indicating whether a sampling phase is early or late compared to an eye opening; and estimating the phase relationship between said input data and said at least three sampling clocks using said at least first pseudo-bit error value and said second pseudo-bit error value, and providing at least a first phase control signal and a second phase control signal to a phase shifter according to said estimated phase relationship, said phase shifter including low-pass filtering the first phase control signal and the second phase control signal so that the first second phase control signal and the second phase control signal are determined at least in part by the past history of random jitters on said data signals, the phase controller implementing at least two loop control paths, a first control path having a first phase control signal to control the phase width from an advanced sampling phase to a delayed sampling phase and a second control path having a second phase control signal to control the position of a center sampling phase and, as a result of the change in the center sampling phase, to also control the positions of the advanced and delayed sampling phases;

wherein said first phase control signal is generated by calculating a difference between said first pseudo-bit error value and said second pseudo-bit error value and said second phase control signal is generated by calculating a sum of said first pseudo-bit value and said second pseudo-bit error value.

5. A data recovery method for a digital data stream of input data, comprising:

sampling the input data at at least three sampling points, by a data sampler, where said at least three sampling points are defined by at least three corresponding sampling clocks and arranged in time by a predetermined order and adjustable time difference, and wherein at least one of the at least three sampling points is an intermediate sampling point intermediate in time between an early boundary sampling point and a late boundary sampling point;

generating, after the sampling of the input data, a first pseudo bit-error signal that is a result of comparison of input data sampled at the early boundary sampling point with the recovered data, wherein the recovered data may vary from sample to sample;

generating, after the sampling of the input data, a second pseudo bit-error signal that is a result of comparison of input data sampled at the late boundary sampling point with the recovered data; and using the first and second pseudo bit-error signals to estimate a phase relationship between the sampled input data and said at least three corresponding sampling clocks and adjusting the phases of said at least three corresponding sampling clocks in response to receipt of said estimated phase relationship so that at least one of the early boundary sampling point and the late boundary sampling point is marginally matched to the edge of an eye opening and the intermediate sampling point serves as the sampling point for data recovery.

6. The method of claim 5, wherein the at least three sampling clocks are adjustable and the at least three sampling clocks are used as triggers for sampling the input data.

7. A data recovery method for a digital data stream, said method comprising:

sampling an input data stream at at least three sampling points, by a data sampler, to generate at least three sampled input data without comparing the input data stream with a reference signal, where said at least three sampling points are defined by at least three corresponding sampling clocks and arranged in time by a predetermined order and adjustable time difference and wherein the at least three sampled input data include a first sampled input data sampled to correspond to an early sampling boundary, a third sampled input data sampled to correspond to a late sampling boundary, and a second sampled input data sampled at an intermediate sampling point between the early sampling boundary and the late sampling boundary and corresponding to a data sampling clock and a recovered data, wherein the recovered data may vary from sample to sample;

generating, after the sampling, a first pseudo bit-error signal from a direct comparison of the first sampled input data sampled at the early sampling boundary with the recovered data sampled at the data sampling clock;

generating, after the sampling, a second pseudo bit-error signal from direct comparison of the second sampled input data sampled at the late sampling boundary with the recovered data sampled at the data sampling clock; and using the first and second pseudo bit-error signals to estimate a phase relationship between the sampled input data and said at least three corresponding sampling clocks and adjusting the phases of said at least three corresponding sampling clocks in response to receipt of said estimated phase relationship so that the early boundary sampling point and late boundary sampling points are marginally matched to the edges of an eye opening and the intermediate sampling point is used for data recovery to obtain the recovered data.

8. The method of claim 7, wherein the at least three sampling clocks are adjustable and the at least three sampling clocks are used as triggers for sampling the input data.

9. A data recovery method for a digital data stream of input data, said method comprising:

receiving at least two control signals, by a phase controller, and outputting at least three sampling clocks in a bit time, where the phase of said at least three sampling clocks are adjustable;

sampling the input data using said at least three sampling clocks as triggers, and generating at least three sampled data signals from said sampling, where one of said at least three sampled data signals is used to output recovered data;

comparing said at least three sampled data signals to said recovered data and generating at least a first pseudo-bit error value and a second pseudo-bit error value;

estimating the phase relationship between the input data and said at least three sampling clocks using said at least first pseudo-bit error value and said second pseudo-bit error value; and providing said at least two control signals to a phase shifting means according to said estimated phase relationship.

10. A data recovery apparatus for a digital data stream of input data, comprising:

a phase shifter receiving at least two control signals and outputting at least three sampling clocks in a bit time, where the phase of said at least three sampling clocks are adjustable;

a data sampler receiving said at least three sampling clocks and sampling the input data using said at least three sampling clocks as triggers and providing at least three sampled data signals, where one of said at least three sampled data signals is used to output recovered data;

a compare logic receiving said at least three sampled data signals and comparing said at least three sampled data signals to said recovered data and providing at least a first pseudo-bit error value and a second pseudo-bit error value;

a phase controller receiving said at least first pseudo-bit error value and said second pseudo-bit error value and estimating the phase relationship between the input data and said at least three sampling clocks using said at least first pseudo-bit error value and said second pseudo-bit error value; and a phase shifter for adjusting the phases of said at least three sampling clocks in response to receipt of said at least two control signals and said estimated phase relationship.

11. An apparatus for data recovery in a digital data stream of input data, comprising:

a data sampler sampling the input data at at least three sampling points, where said at least three sampling points are defined by at least three corresponding sampling clocks and arranged in time by a predetermined order and adjustable time difference, at least one of the at least three sampling points is an intermediate sampling point intermediate in time between an early boundary sampling point and a late boundary sampling point;

a comparison logic generating: (i) a first pseudo bit-error signal that is a result of comparison of input data sampled at the early boundary sampling point with the recovered data, and (ii) a second pseudo bit-error signal that is a result of comparison of input data sampled at the late boundary sampling point with the recovered data, and wherein the recovered data may vary from sample to sample;

a phase controller receiving and using the first and second pseudo bit-error signals to estimate a phase relationship between the sampled input data and said at least three corresponding sampling clocks; and a phase shifter adjusting the phases of said at least three corresponding sampling clocks in response to receipt of said estimated phase relationship so that at least one of the early boundary sampling point and the late boundary sampling point is marginally matched to the edge of an eye opening and the intermediate sampling point serves as the sampling point for data recovery.

* * * * *